(12) United States Patent
Christensen et al.

(10) Patent No.: US 11,342,130 B2
(45) Date of Patent: May 24, 2022

(54) METHOD OF MAKING A PHOTOVOLTAIC DEVICE ON A SUBSTRATE AT HIGH SPEED WITH PEROVSKITE SOLUTION

(71) Applicant: Energy Materials Corporation, Rochester, NY (US)

(72) Inventors: Scott Kenneth Christensen, North Chili, NY (US); Qi Li, Rochester, NY (US); Thomas Nathaniel Tombs, Rochester, NY (US); Stephan J. DeLuca, Meadville, PA (US)

(73) Assignee: Energy Materials Corporation, Rochester, NY (US)

( * ) Notice: Subject to any disclaimer, the term of this patent is extended or adjusted under 35 U.S.C. 154(b) by 364 days.

(21) Appl. No.: 16/426,341

(22) Filed: May 30, 2019

(65) Prior Publication Data

US 2020/0381183 A1     Dec. 3, 2020

(51) Int. Cl.
*H01L 51/00*     (2006.01)
*H01G 9/20*     (2006.01)
(Continued)

(52) U.S. Cl.
CPC ......... *H01G 9/2009* (2013.01); *H01G 9/0036* (2013.01); *H01G 9/2018* (2013.01);
(Continued)

(58) Field of Classification Search
CPC . H01L 51/4213; H01L 51/441; H01L 51/424; H01L 51/4206; H01L 51/0004;
(Continued)

(56) References Cited

U.S. PATENT DOCUMENTS

| | | | |
|---|---|---|---|
| 9,583,724 B2 | 2/2017 | Huang et al. | |
| 2015/0311364 A1* | 10/2015 | Wu | H01L 51/0003 438/82 |

(Continued)

OTHER PUBLICATIONS

Stranks, S. D. and Snaith, H. J., "Metal-halide perovskites for photovoltaic and light-emitting devices", Nat. Nanotechnol. 10, 391-402 (2015).

(Continued)

*Primary Examiner* — Ermias T Woldegeorgis
(74) *Attorney, Agent, or Firm* — Andrew J. Anderson, Esq.; Harter Secrest & Emery LLP

(57) ABSTRACT

A continuous inline method for production of photovoltaic devices at high speed includes: providing a substrate; depositing a first carrier transport solution layer with a first carrier transport deposition device to form a first carrier transport layer on the substrate; depositing a Perovskite solution comprising solvent and perovskite precursor materials with a Perovskite solution deposition device on the first carrier transport layer; drying the deposited Perovskite solution to form a Perovskite absorber layer; and depositing a second carrier transport solution with a second carrier transport deposition device to form a second carrier transport layer on the Perovskite absorber layer, wherein the deposited Perovskite solution is dried at least partially with a fast drying device which causes a conversion reaction and the Perovskite solution to change in optical density by at least a factor of 2 in less than 0.5 seconds after the fast drying device first acts on the Perovskite solution.

20 Claims, 4 Drawing Sheets

(51) Int. Cl.
 *H01G 9/00* (2006.01)
 *H01L 51/42* (2006.01)
 *H01L 51/44* (2006.01)

(52) U.S. Cl.
 CPC ....... *H01G 9/2095* (2013.01); *H01L 51/0004* (2013.01); *H01L 51/0007* (2013.01); *H01L 51/0027* (2013.01); *H01L 51/0028* (2013.01); *H01L 51/0077* (2013.01); *H01L 51/0097* (2013.01); *H01L 51/4253* (2013.01); *H01L 51/442* (2013.01)

(58) Field of Classification Search
 CPC .............. H01L 51/0007; H01L 51/0027; H01L 51/0028; H01L 51/0077; H01L 51/0097; H01L 51/4253; H01L 51/442; H01L 51/42; H01L 51/0003; H01L 51/0026; H01G 9/2009; H01G 9/0036; H01G 9/2018; H01G 9/2095; Y02P 70/50; Y02E 10/542; Y02E 10/549
 See application file for complete search history.

(56) References Cited

U.S. PATENT DOCUMENTS

| | | | | |
|---|---|---|---|---|
| 2015/0340632 | A1* | 11/2015 | Etgar | H01L 51/0032 136/255 |
| 2018/0075979 | A1* | 3/2018 | Jung | H01L 51/0037 |
| 2019/0326065 | A1 | 10/2019 | Huang et al. | |
| 2020/0028022 | A1 | 1/2020 | Huang et al. | |
| 2020/0102666 | A1 | 4/2020 | Bakr et al. | |
| 2020/0377532 | A1 | 12/2020 | Li et al. | |
| 2020/0381642 | A1 | 12/2020 | Christensen et al. | |

OTHER PUBLICATIONS

Deng et al., "Scalable fabrication of efficient organolead trihalide perovskite solar cells with doctor-bladed active layers", Energy Environ. Sci. 8, 1544-1550 (2015).
Yang et al., "perovskite ink with wide processing window for scalable high-efficiency solar cells", Nat. Energy 2, 17038 (2017).
Barrows et al., "Efficient planar heterojunction mixed-halide perovskite solar cells deposited via spray-deposition", Energy Environ. Sci. 7, 2944-2950 (2014).
Hwang et al., "Toward large scale roll-to-roll production of fully printed perovskite solar cells", Adv. Mater. 27, 1241-1247 (2015).
He et al., "Meniscus-assisted solution printing of large-grained perovskite films for high-efficiency solar cells", Nat. Commun. 8, 16045 (2017).
Chen et al. "A scalable electrodeposition route to the low-cost, versatile and controllable fabrication of perovskite solar cells", Nano Energy 15, 216-226 (2015).
Kim et al., "Gravure-Printed Flexible perovskite Solar Cells: Toward Roll-to-Roll Manufacturing", Adv. Sci. (2019).
Deng et al., "Vividly colorful hybrid perovskite solar cells by doctor-blade coating with perovskite photonic nanostructures", Royal Society of Chemistry, Materials Horizon, DOI: 10.1039/c5mh00126a (2015).
Zilberberg et al., "Metal-nanostructures—a modern and powerful platform to create transparent electrodes forthin-film photovoltaics", Royal Society of Chemistry, Journal of Materials Chemistry A, DOI: 10.1039/c6ta05286j (2016).
International Search Report and Written Opinion for PCT/US2020/034901 (12 pages), completed on Sep. 17, 2020.
Gao et al., "Highly Efficient, Solution-Processed CsPb12Br Planar Heterojunction Perovskite Solar Cells via Flash Annealing" ACS Photonics 2018, 5, 104-4110 (2018).
Kim et al., "Slot die coated planar perovskite solar cells via blowing and heating assisted one step deposition" Solar Energy Materials and Solar Cells 179 (2018) 80-86. (Year: 2018).
Zuo et al., "One step roll-to-roll air processed high efficiency perovskite solar cells" Nano Energy 46 (2018)185-192 (Year: 2018).
Hendriks et al., "2-Methoxyethanol as a new solvent for processing methylammonium lead halide perovskite solar cells", Journal of Materials Chemistry A, Jan. 3, 2017 (Publication date), vol. 5, No. 5, pp. 2346-2354.
Galagan et al., "Roll-to-roll slot die coated perovskite for efficient flexible solar cells", Advanced Energy Materials, Oct. 8, 2018 (Online publication date), vol. 8, No. 32, Article No. 1801935, Internal pp. 1-7.
Noel, et al., "Highly crystalline methylammonium lead tribromide perovskite films for efficient photovoltaic devices", ACS Energy Letters, Apr. 30, 2018 (Publication date), vol. 3, No. 6, pp. 1233-1240 and supporting information.
Jeon et al., "Hybrid perovskites: effective crystal growth for optoelectronic applications", Advanced Energy Materials, May 24, 2017 (Online publication date), vol. 7, No. 19, Article No. 1602596, Internal pp. 1-29.
Mehdi et al., "MAPbBr3 perovskite solar cells via a two-step deposition process", RSC Advances, Apr. 26, 2019 (Publication date), vol. 9, No. 23, pp. 12906-12912.

\* cited by examiner

METHOD OF MAKING A PHOTOVOLTAIC DEVICE ON A SUBSTRATE AT HIGH SPEED WITH PEROVSKITE SOLUTION

STATEMENT REGARDING FEDERALLY SPONSORED RESEARCH OR DEVELOPMENT

This invention was made with government support under Grant No. DE-EE0008128 awarded by the Solar Energy Technologies Office, Department of Energy. The government has certain rights in the invention.

CROSS-REFERENCE TO RELATED APPLICATIONS

Reference is made to concurrently filed, commonly assigned, U.S. patent application Ser. No. 16/426,191, filed May 30, 2019, entitled: "Method of Making a Perovskite Layer at High Speed," by S. Christensen et al.; and to concurrently filed, commonly assigned, U.S. patent application Ser. No. 16/426,439, filed May 30, 2019, entitled: "A Perovskite Solution for Making a Perovskite Layer at High Speed," by Q. Li et al., each of which is incorporated herein by reference.

FIELD

The present disclosure relates to methods of making a photovoltaic device on a substrate at high speed with a Perovskite solution.

BACKGROUND

Since their first report in 2009, rapid improvements have enabled halide perovskite solar cells (PSCs) to become a promising technology for converting light to electricity as part of optoelectronic devices. To date, the power conversion efficiencies (PCEs) of solution-processed PSCs have been certified above 23 percent, which is higher than the current dominant photovoltaic technology that is based on multicrystalline silicon (see National Renewable Energy Laboratories Efficiency Chart, https://www.nrel.gov/pv/assets/pdfs/pv-efficiency-chart.20181217.pdf accessed Dec. 17, 2018). Whereas crystalline silicon is rigid, brittle, and requires costly, energy-intensive fabrication procedures, perovskites are flexible, easily processed at low temperatures, and up to a thousand times thinner. Furthermore, perovskites are solution-processable, which enables their manufacture with scalable, low-cost methods. These attributes open new opportunities to integrate solar power creatively and inexpensively into previously inaccessible markets, such as electric vehicles and buildings. PSCs also have the important advantage of having minimal impact on PCE as temperature increases, unlike silicon based solar cells, which exhibit significant power loss in typical operating environments. PSCs advantages and high PCE put them on the path to be the next generation technology for utility, commercial, and residential photovoltaic applications.

Most top performing PSCs have been fabricated by a spin-coating method, which is unsuitable for high throughput and scalable module production. However, several scalable film deposition techniques have been developed for PSC fabrication, such as doctor-blading, spray deposition, slot-die coating, gravure coating, ink jet printing, dip coating, chemical bath deposition, flexographic, and electrodeposition. See Stranks, S. D. and Snaith, H. J., Metal-halide perovskites for photovoltaic and light-emitting devices. Nat. Nanotechnol. 10, 391-402 (2015); Deng, Y. et al., Scalable fabrication of efficient organolead trihalide perovskite solar cells with doctor-bladed active layers, Energy Environ. Sci. 8, 1544-1550 (2015); Yang, M. et al., perovskite ink with wide processing window for scalable high-efficiency solar cells, Nat. Energy 2, 17038 (2017); Barrows, A. T. et al., Efficient planar heterojunction mixed-halide perovskite solar cells deposited via spray-deposition, Energy Environ. Sci. 7, 2944-2950 (2014); Hwang, K. et al., Toward large scale roll-to-roll production of fully printed perovskite solar cells, Adv. Mater. 27, 1241-1247 (2015); He, M. et al. Meniscus-assisted solution printing of large-grained perovskite films for high-efficiency solar cells, Nat. Commun. 8, 16045 (2017); Chen, H., et al. A scalable electrodeposition route to the low-cost, versatile and controllable fabrication of perovskite solar cells, Nano Energy 15, 216-226 (2015); Kim, Y. Y. et al., Gravure-Printed Flexible perovskite Solar Cells: Toward Roll-to-Roll Manufacturing, Adv. Sci. 2019; and Deng, Y., et al., Vividly colorful hybrid perovskite solar cells by doctor-blade coating with perovskite photonic nanostructures, Mater. Horiz. 2, 578-583 (2015), each of which is incorporated by reference in its entirety. A next step towards the scalable fabrication of PSCs is to develop methods to make the perovskite layer using high speed equipment suitable for high volume manufacturing. In order for PSCs to gain market share in existing solar markets the speed of production must be fast enough so that the capital equipment costs do not overly burden the ability to scale up for production and also so that the final cost of PSCs is competitive with the already mature manufacturing state of silicon-based solar cells. While the methods cited above are scalable in principle, they have not yet demonstrated deposition speeds necessary to produce low-cost PSCs that can compete with the current silicon technologies. Forming uniform and defect free perovskite layers on flexible multilayer substrates to make PSCs in a cost-effective manner remains a great challenge due to the complexity of depositing and drying a perovskite solution with high speed production equipment.

SUMMARY

In accordance with an embodiment of the present disclosure, a method of making a photovoltaic device is described comprising: providing a substrate; depositing a first carrier transport solution layer with a first carrier transport deposition device to form a first carrier transport layer on the substrate; depositing a Perovskite solution comprising solvent and perovskite precursor materials with a perovskite solution deposition device on the first carrier transport layer; drying the deposited Perovskite solution to form a Perovskite absorber layer; and depositing a second carrier transport solution with a second carrier transport deposition device to form a second carrier transport layer on the Perovskite absorber layer, wherein the deposited Perovskite solution is dried at least partially with a fast drying device which causes a conversion reaction and the Perovskite solution to change in optical density by at least a factor of 2 in less than 0.5 seconds after the fast drying device first acts on the Perovskite solution.

Various embodiments in accordance with the disclosure have the advantage that a Perovskite photovoltaic device can be manufactured at high speed, thereby enabling, e.g., low cost production of a new class of photonic devices such as high efficiency solar cells.

BRIEF DESCRIPTION OF THE DRAWINGS

FIG. 2a shows the perovskite solution on a flexible multilayer substrate after the deposition of the perovskite solution. FIG. 2b shows a partially dry perovskite layer solution after the first drying step. FIG. 2c shows an immobile layer of perovskite crystals or intermediate phase on a flexible multilayer substrate after a second drying step. FIG. 2d shows the completed perovskite layer on the flexible multilayer substrate after an annealing step.

It is to be understood that the attached drawings are for purposes of illustrating the concepts of the disclosure and may not be to scale. Identical reference numerals have been used, where possible, to designate identical features that are common to the figures.

DETAILED DESCRIPTION

The present disclosure is inclusive of combinations of the embodiments described herein. References to "a particular embodiment" and the like refer to features that are present in at least one embodiment of the disclosure. Separate references to "an embodiment" or "particular embodiments" or the like do not necessarily refer to the same embodiment or embodiments; however, such embodiments are not mutually exclusive, unless so indicated or as are readily apparent to one skilled in the art. It should be noted that, unless otherwise explicitly noted or required by context, the word "or" is used in this disclosure in a non-exclusive sense.

The example embodiments of the present disclosure are illustrated schematically and not necessarily to scale for the sake of clarity. One of ordinary skill in the art will be able to readily determine the specific size and interconnections of the elements of the example embodiments of the present disclosure. It is to be understood that elements not specifically shown, labeled, or described can take various forms well known to those skilled in the art. It is to be understood that elements and components can be referred to in singular or plural form, as appropriate, without limiting the scope of the disclosure.

Figure 1:
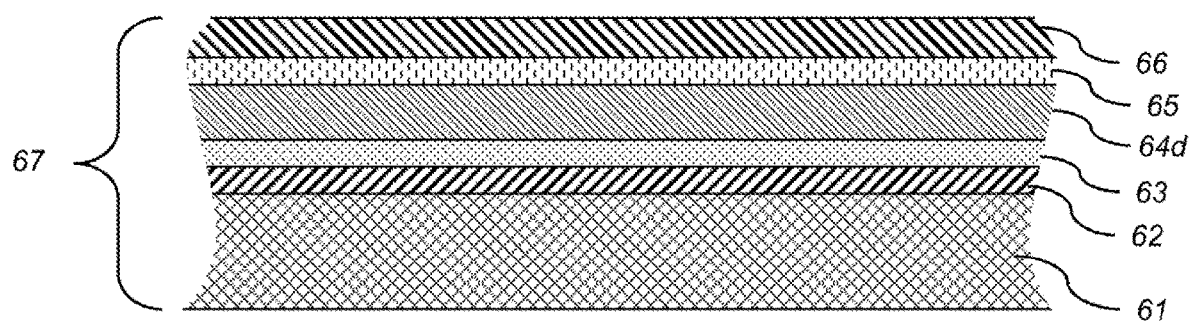
FIG. 1 illustrates a cross section of a portion of a perovskite device wherein multiple functional layers are shown on a flexible support.

Shown in FIG. 1 is a cross section of a portion of a perovskite device, 67. The structure of the perovskite device 67 comprises a relatively thick (e.g., 5 to 200 microns) flexible support 61 with several, much thinner, functional layers. On top of the flexible support 61 is first conducting layer 62, a first carrier transport layer 63, a completed perovskite layer 64d, a second carrier transport layer 65, and a second conducting layer 66. Support 61, along with layers 62 and 63 form a multilayer substrate 60 for perovskite layer 64, as further shown in FIGS. 2a-2d. For some applications the first conducting layer 62 and the first carrier transport layer 63 are optically transparent in the frequency range that the perovskite layer 64d converts photons into electron-hole pairs, typically the visible frequency range. For other applications the second conducting layer 66 and the second carrier transport layer 65 are optically transparent in the frequency range that the perovskite layer 64d converts photons into electron-hole pairs. For PIN photovoltaic devices the optically transparent carrier transport layer transports holes and blocks electrons. For NIP photovoltaic devices the optically transparent carrier transport layer transports electrons and blocks holes. The methods for uniformly depositing a completed perovskite layer 64d described in the disclosure apply to both NIP and PIN structures.

The term "perovskite solution" is defined as a solution or colloidal suspension that can be used to generate a continuous layer of organic-inorganic hybrid perovskite material (referred here as perovskite layer) with an $ABX_3$ crystal lattice where 'A' and 'B' are two cations of very different sizes, and X is an anion that coordinates to both cations. A perovskite solution comprises perovskite precursor material and solvent, and may also contain additives to aid in crystal growth or to modify crystal properties. Perovskite precursor material is defined as an ionic species where at least one of its constituents becomes incorporated into the final perovskite layer $ABX_3$ crystal lattice. Organic perovskite precursor material are materials whose cation contains carbon atoms while inorganic perovskite precursor material are materials whose cation contains metal but does not contain carbon.

For small quantities of perovskite solution, a high concentration of precursor materials can be used when making high performance lab-scale coatings. However, when depositing perovskite solution at high speed on pilot scale or full-scale manufacturing equipment these high concentration solutions have been found to be unstable for the required duration to enable a uniform coating. Unstable solutions form non-colloidal solids in the solution prior to coating that inhibit the deposition and drying process and produce nonfunctional photovoltaic devices. Hence, lower concentrations of precursors must be specified for high speed coatings. Lower concentration solutions require thicker wet coatings to achieve the appropriate dry thickness for the perovskite layer. For thicker wet coatings it has been found that simple drying methods do not produce a uniform coating suitable for functional photovoltaic devices. One reason for the non-uniformity is due to convective flow in the wet coating that leads to a highly non-uniform dry layer due to the movement of the liquid in the coated layer. Convective flow results from the evaporative cooling at the surface of the wet laydown that leads to strong thermal gradients in the wet coating. Convective flow increases as the thickness of the wet coating increases and also as the viscosity of the wet coating decreases. The very low viscosity of the perovskite solution coupled with the aforementioned need for a thick wet coating to enable high speed manufacturing makes it very challenging to make a uniform dry perovskite layer at high speed.

A second reason for the variability in the dry perovskite layer is variability in the vapor concentration of the evaporating solvent above the wet coating. Even small differences in air flow above the wet coating cause significant changes in the vapor concentration above the wet coating resulting in non-uniformities in the dry layer due to spatial variations in the evaporation rate across and along the substrate. One method known by those skilled in the art of high speed drying of a coated film is to blow a gas across the surface of the wet film so that evaporating solvent is continuously removed thus reducing the variability in the vapor concentration above the wet coating. However, perovskite solutions typically have very low viscosity, e.g., less than 10 centipoise (viscosity changes with applied shear), due to the nature of the dissolved solids and the limited selection of useful solvents and additives. The low viscosity of perovskite solutions causes blow marks in the dry layer when a gas is blown across the surface of the wet solution. Non-uniformity in the dry layer caused by blow marks makes the layer non-functional because discontinuities become electrical shorts in photovoltaic devices. Thinner wet laydowns reduce the non-uniformities caused by blowing air across the film but, as previously discussed, a relatively thick wet laydown is required when making a high speed deposition of perovskite solution.

A third reason for the variability in the dry perovskite layer is due to de-wetting of the perovskite solution from the flexible multilayer substrate 60, which causes holes to form in the perovskite layer that severely degrade the performance of the completed perovskite device. Carrier transport layers used in perovskite devices may be hydrophobic to improve device performance and most perovskite solutions tend to poorly wet the hydrophobic carrier transport layers. Perovskite solution dewetting is exacerbated by depositing thinner layers of perovskite solution and by increasing the drying time.

To enable high speed production of a uniform perovskite layer, a novel perovskite solution has been formulated using a large proportion (e.g., at least 50 weight percent of total solvent, preferably at least 75 weight percent of total solvent, more preferably at least 90 weight percent of total solvent) of a low boiling point (e.g., less than 150 degrees Celsius, preferably less than 135 degrees Celsius) solvent. Using the novel drying method of the disclosure, a low boiling point solvent can be made to evaporate quickly from the perovskite solution after deposition on a substrate thus minimizing movement of the crystals that form as the perovskite solution dries. Solvents that do not strongly coordinate with the perovskite precursors further enable short annealing times. Short annealing times are desirable because they enable higher production speeds. Alcohol based solvents have been identified that do not strongly coordinate with the perovskite precursors, provide the proper solubility of the inorganic precursors, and have been shown to produce a perovskite solution that is stable for use in high volume manufacturing of perovskite layers and photovoltaic devices. Examples of alcohol-based solvents suitable for use at high proportions in the perovskite solution include 2-methoxyethanol, 2-ethoxyethanol, 2-butoxyethanol, 2-isopropoxyethanol, methanol, propanol, butanol, and ethanol. Mixtures of solvents are envisioned for use in the perovskite solution to tune the evaporation profile to further optimize the drying process. Suitable solvent additives useful for modifying evaporation rate of the solvent, e.g., include dimethylformamide, acetonitrile, dimethyl sulfoxide, N-methyl-2-pyrrolidone, dimethylacetamide, gamma-butyrolactone, phenoxyethanol, acetic acid, and urea.

The preferred perovskite solution is formulated with greater than 30 percent by weight of solvent (e.g., 30-82 percent by weight) and at least 18 percent by weight of solids (e.g., 18-70 percent by weight, preferably 25-60 percent by weight or 30-45 percent by weight), where the total solids concentration of the perovskite solution is between 30 percent and 70 percent by weight of its saturation concentration at the provided solution temperature. The preferred provided solution temperature is between 20 and 50 degrees Celsius. The preferred solvent is an alcohol and has a boiling point less than 135 degrees Celsius. The preferred solvent is 2-methoxyethanol, which has a boiling point of 125 degrees Celsius. The disclosed perovskite solution formulations have the advantage of providing perovskite solutions that are stable at convenient handling and storage temperatures of, e.g., from 20 to 50 degrees Celsius and in particular typical room temperatures of from 20 to 25 degrees Celsius, and which can be used to manufacture a uniform Perovskite layer at high speed thereby enabling low cost production of high efficiency solar cells with low equipment costs.

Uniform perovskite layers have been made at high production speeds with the novel drying method and perovskite solution. However, it has been found that the time required for the perovskite solution to form homogeneous nuclei and grow may be longer than the time required to evaporate the low boiling point solvent in such a way as to produce a uniform perovskite layer. A uniform perovskite layer with optimum sized crystals is needed to make perovskite devices with high photovoltaic energy output. A crystal growth modifier added to a perovskite solution with a low boiling point solvent have been found that optimize the performance of perovskite photovoltaic devices. A crystal growth modifier is defined as an additive that either alters the amount of time for homogeneous crystal growth or alters the rate of homogeneous crystal growth when drying a perovskite solution. Examples of crystal growth modifiers that are especially useful in perovskite solutions for making high performance perovskite layers include dimethyl sulfoxide, N-methyl-2-pyrrolidone, gamma-butyrolactone, 1,8-diiodooctane, N-cyclohexyl-2-pyrrolidone, water, dimethylacetamide, acetic acid, cyclohexanone, alkyl diamines, and hydrogen iodide. A preferred concentration of crystal growth modifier is less than about 10 percent by weight of the coating solution (e.g., 0.01 to 10 percent by weight). A more preferred concentration of crystal growth modifier is less than about 2 percent by weight of the coating solution (e.g., 0.01 to 2 percent by weight).

Another additive for a perovskite solution that alters the perovskite layer to improve the performance of perovskite devices is a crystal grain boundary modifier. A crystal grain boundary modifier is defined as an additive that improves the quality of the grain boundary, for example be altering the electrical properties of the perovskite crystal grain boundary or reducing trap states at perovskite crystal grain boundary interfaces. Examples of crystal grain boundary modifiers that are especially useful in perovskite solutions for making high performance perovskite layers include choline chloride, phenethylamine, hexylamine, 1-α-phosphatidylcholine, polyethylene glycol sorbitan monostearate, sodium dodecyl sulfate, Poly(methyl methacrylate), Polyethylene glycol, pyridine, thiophene, ethylene carbonate, propylene carbonate, fullerenes, poly(propylene carbonate), and didodecyldimethylammonium bromide. A preferred concentration of crystal grain boundary modifier is less than about 2 percent by weight of the coating solution (e.g., 0.01 to 2 percent by weight). A more preferred concentration of crystal grain boundary modifier is less than about 0.2 percent by weight of the coating solution (e.g., 0.01 to 0.2 percent by weight).

Examples of inorganic perovskite precursors for making perovskite solutions include lead (II) iodide, lead (II) acetate, lead (II) acetate trihydrate, lead (II) chloride, lead (II) bromide, lead nitrate, lead thiocyanate, tin (II) iodide, rubidium halide, potassium halide, and cesium halide. Examples of organic perovskite precursors for making perovskite solutions include methylammonium iodide, methylammonium bromide, methylammonium chloride, methylammonium acetate, formamidinium bromide, and formamidinium iodide. To produce a high performance perovskite device it is preferred that the organic perovskite precursor material has a purity greater than 99 percent by weight and the inorganic perovskite precursor has a purity greater than 99.9 percent by weight. The inorganic perovskite precursor contains a metal cation and preferred metal cation is lead. In the preferred embodiment the molar ratio of organic perovskite precursor material to inorganic perovskite precursor material is between one and three.

In one embodiment of the disclosure the perovskite solution comprises an organic perovskite precursor material, an inorganic perovskite precursor material, and a solvent wherein the amount of solvent is greater than 30 percent by weight and the perovskite solution has a total solids concentration by weight that is between 30 percent and 70 percent of the perovskite solution's saturation concentration at the provided solution temperature (i.e., temperature the solution is maintained at prior to deposition of the solution onto the flexible substrate. In preferred embodiments, the solvent may comprise one or more alcohols and the preferred provided solution temperature is between 20 and 50 degrees Celsius. In further preferred embodiments, it is preferred to have an amount of alcohol that is less than 50 percent by weight and a total solids concentration greater than 35 percent by weight. In another preferred embodiment the perovskite solution has an amount alcohol that is greater than 50 percent by weight and a total solids concentration less than 40 percent by weight. In another preferred embodiment, the perovskite solution has a total solids concentration between 30 and 45 percent by weight and an amount of 2-methoxyethanol that is greater than 55 percent by weight.

Figure 2A:
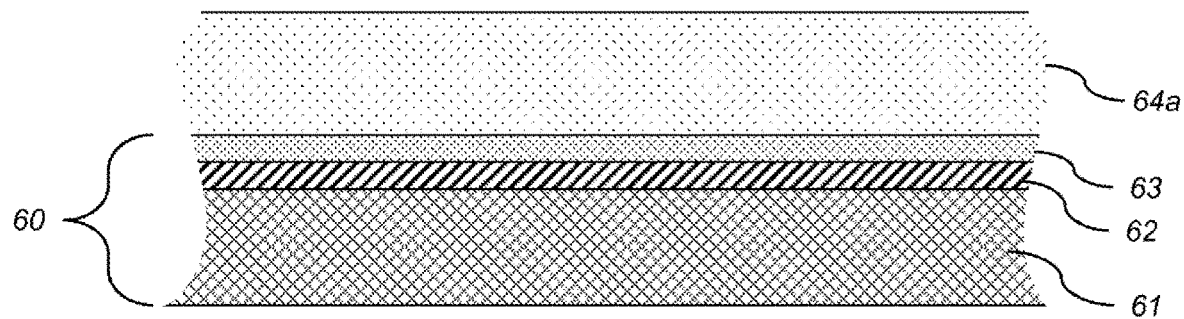
FIGS. 2a, 2b, 2c, and 2d illustrate in cross sections the formation of the perovskite layer on a portion of a multilayer flexible substrate after important steps in various embodiments of the disclosure.

When the perovskite solution dries, perovskite crystals or the intermediate precursor phase for hybrid perovskite crystals (intermediate phase) form. The intermediate phase is a crystal, adduct, or mesophase that is not the desired final crystal lattice, which is $ABX_3$. The intermediate phase, if present, is converted to the desired final crystal lattice by annealing. This formation process has been found to be highly sensitive to variations in the solvent vapor concentration above the wet layer and to convective flow in the wet layer of perovskite solution. A novel multistep method has been developed to form a uniform and functional perovskite layer at high speed. FIGS. 2a, 2b, 2c, and 2d illustrate in cross sections the formation of the perovskite layer on a portion of a multilayer flexible substrate 60 after important steps in embodiments of the disclosure. FIG. 2a shows the layer of perovskite solution 64a on a flexible multilayer substrate 60 immediately after the deposition of the perovskite solution.

Figure 2B:
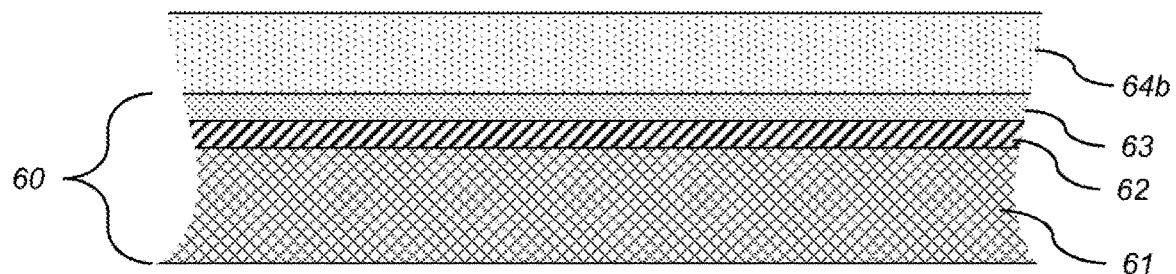
Figure 2C:
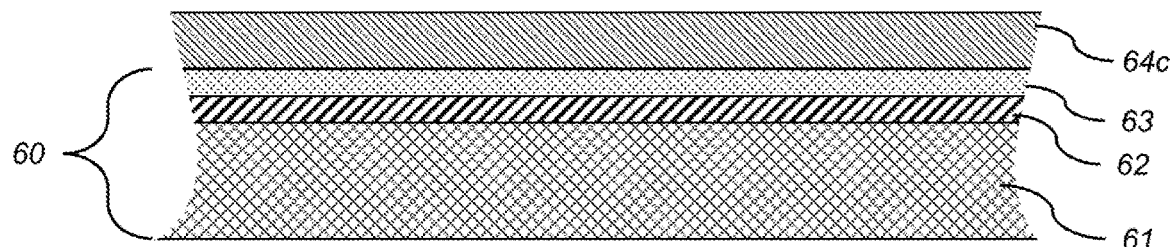
Figure 2D:
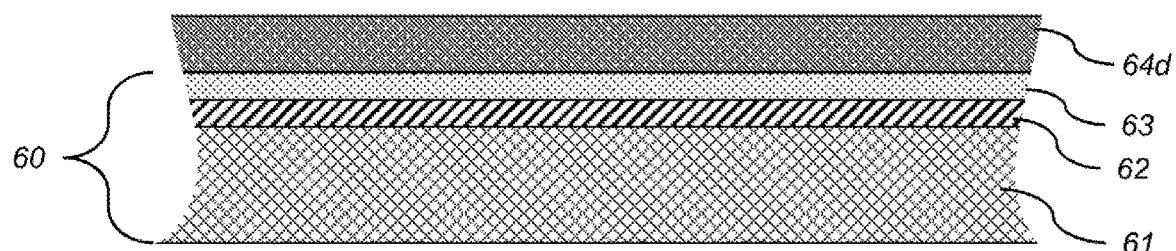

The flexible multilayer substrate 60 comprises a flexible support 61, a first conducting layer 62, and a first carrier transport layer 63. However, in some embodiments the flexible support is the first conducting layer. For example, when a metal foil is used for flexible support 61 it can provide the functionality of the first conducting layer 62. FIG. 2b shows a layer of the partially dry perovskite solution 64b on the flexible multilayer substrate 60 after a first drying step, hence the thickness of the layer of partially dry perovskite solution 64b is less than the thickness of the layer of perovskite solution 64a shown in FIG. 2a. FIG. 2c shows an immobile layer of perovskite crystals or intermediate phases 64c on a flexible multilayer substrate 60 after a second drying step hence the thickness of the immobile layer perovskite crystals or intermediate phases 64c is less than the thickness of the layer of the partially dry perovskite solution 64b shown in FIG. 2b. FIG. 2d shows the completed perovskite layer 64d on the flexible multilayer substrate 60 after an annealing step.

Examples of materials comprising the flexible support 61 include polyethylene terephthalate (PET), thin flexible glass such as Corning® Willow® Glass, polyethylene naphthalate (PEN), polycarbonate (PC), polysulfone, metal foil (e.g. copper, nickel, titanium, steel, aluminum, and tin), and polyimide. With the exception of using metal foil, the preferred thickness of the flexible support 61 is in range from 25 to 200 microns. When metal foil is used the preferred thickness of the metal foil is between 5 and 50 microns.

Examples of materials comprising the first conducting layer 62 when used as the window for the photovoltaic device include transparent and semitransparent electrodes based on metal-nanowires and metal thin-films (see J. Mater. Chem. A, 2016, 4, 14481-14508, which is incorporated by reference in its entirety); metal mesh and metal grid electrodes made with metal nanoparticles, particulate metal paste, and/or electroplating; Poly(3,4-ethylenedioxythiophene) (PEDOT) complex such as poly(3,4-ethylenedioxythiophene):polystyrene sulfonate (PEDOT:PSS); doped and undoped metal oxides such as tin oxide (doped with indium or fluorine), molybdenum oxide, and zinc oxide (doped with aluminum). A metal foil is preferred when the first conducting layer 62 is not on the window side. The metal foil can be made from a wide range of metals but is preferred to be selected from the group consisting of copper, nickel, or stainless steel. The metal foil may have more than one layer of metal such as copper coated with nickel or tin. The metal foil may also be part of a laminate structure and include plastic layers such as PET or polyimide and an adhesive interlayer.

Examples of materials comprising the first carrier transport layer 63 and the second carrier transport layer 65 include poly(triaryl amine) (also known as Poly[bis(4-phenyl)(2,4,6-trimethylphenyl)amine]), poly-(N-vinyl carbazole), PEDOT complex, Poly(3-hexylthiophene), Spiro-MeOTAD (also known as $N^2,N^2,N^{2'},N^{2'},N^7,N^7,N^{7'},N^{7'}$-NT-octakis(4-methoxyphenyl)-9,9'-spirobi[9H-fluorene]-2,2',7,7'-tetramine), fullerenes (e.g. fullerene-C60 and phenyl-C61-butyric acid methyl ester), graphene, reduced graphene oxide, copper(I) thiocyanate, cuprous iodide, and metal oxide (e.g. tin oxide, nickel oxide, cerium oxide, molybdenum oxide, and zinc oxide) and their derivatives. Carrier transport layers can be hole transport layers or electron transport layers depending on the desired structure of the solar cell, e.g. NIP or PIN. Many other carrier transport materials are known by those skilled in the art and are envisioned as possible materials for this disclosure.

Figure 3:
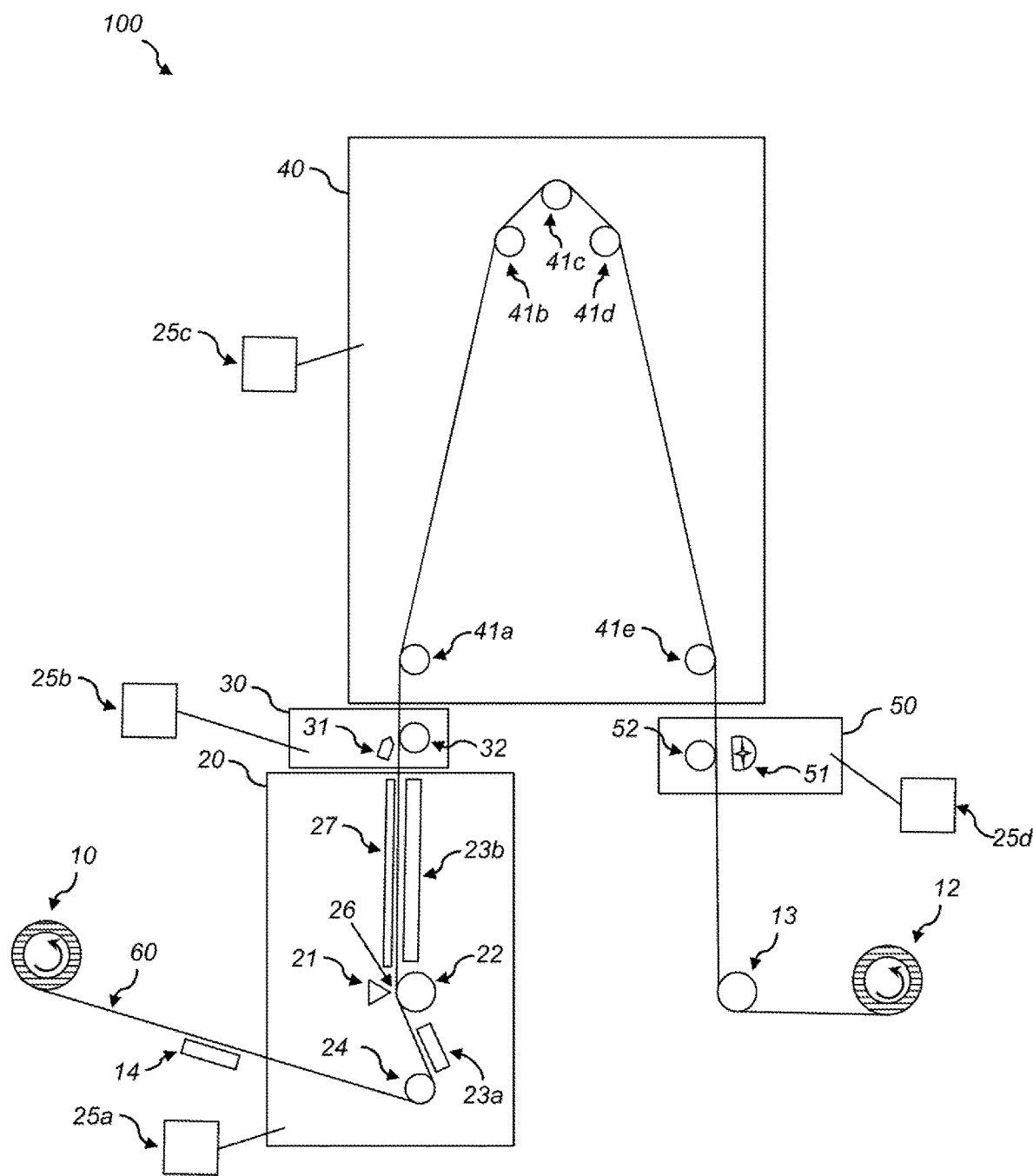
FIG. 3 is a schematic side view of an exemplary printing system for roll-to-roll printing on a flexible multilayer substrate.

Many types of deposition and drying devices are known to those skilled in the art and a variety of devices are envisioned to be configured to use the methods described in the embodiments of the disclosure. A high speed, roll-to-roll (R2R) deposition and drying device that conveys a flexible substrate from a roll through the device will enable production of a perovskite layer at low cost. FIG. 3 shows a schematic of an exemplary R2R deposition and drying device 100 that will be used to describe preferred embodiments of the disclosure. Additional configurations can be adapted to enable the multistep process of the disclosure by those skilled in the art. A flexible multilayer substrate 60 is unwound from a unwind roll 10 and threaded through a deposition (and first drying step) section 20, a fast drying (second drying step) section 30, a long duration heating section 40, and a short duration heating section 50, then wound onto a rewind roll 12. Other components in R2R deposition and drying devices known in the industry are considered useful for this disclosure but are not shown in FIG. 3. For example, a cooling section (not shown) may be useful prior to the rewind roll 12. The direction of movement of the flexible multilayer substrate 60 through the R2R deposition and drying device 100 is identified by the arrows in the unwind roll 10 and the rewind roll 12. A surface treatment device 14 conditions the surface of the flexible multilayer substrate 60 prior to deposition of the perovskite solution. Surface treatment devices include corona discharge, ozone (created, for example, with ultraviolet radiation), and plasma. Surface treatment devices can operate in ambient air, conditioned air (where temperature and relative humidity are controlled), oxygen, or inert gas such as nitrogen or argon.

The deposition (and first drying step) section 20 of the R2R deposition and drying device 100 includes one or more conveyance rollers 24 to direct the path of the flexible multilayer substrate 60 so that it is correctly presented to the deposition device 21 as well as correctly conveyed through the deposition section 20. Conveyance rollers, tensioning rollers, and web guidance rollers are typically used throughout deposition and drying devices to aid in conveying flexible substrates, controlling tension and position. A conveyance roller 13 is shown prior to the rewind roll 12 and conveyance rollers 41a-e are shown in the long duration heating section 40. To simplify FIG. 3 additional rollers are not shown. Conveyance rollers may include air bearings to minimize or eliminate contact with the flexible multilayer substrate 60. Air flotation methods (not shown) known by those skilled in the art may also be used to minimize or eliminate contact between conveyance rollers and the flexible multilayer substrate 60.

The deposition device 21 that deposits a layer of perovskite solution comprising a solvent and perovskite precursor material to the flexible multilayer substrate 60 can be any number of known deposition devices but is preferred to be based on a slot die or gravure system (direct, reverse, or offset) deposition device. Other deposition devices envisioned for use in the disclosure include spray, dip coat, inkjet, flexographic, rod, and blade. The perovskite solution is supplied to the deposition device 21 by methods and devices known by those skilled in the art (not shown). The deposited perovskite solution layer is partially dried in section 20 in a first drying step by removing a first portion of solvent from the deposited solution while heating the deposited solution to a coated layer temperature. To optimize the drying conditions and to improve the wettability of the layer of perovskite solution 64a deposited on to the flexible multilayer substrate 60 the temperature of the perovskite solution and the coating device is preferably controlled by a temperature controller (not shown). The setpoint for the temperature of the perovskite solution 64a deposited on the multilayer substrate 60 depends on the formulation of the perovskite solution. The preferred temperature range for the heated deposited perovskite solution in the first drying step is between 30 and 100 degrees Celsius and a more preferred temperature range is between 35 and 60 degrees Celsius. The thickness of the perovskite solution 64a initially deposited on the flexible multilayer substrate 60 is preferably less than 10 microns to minimize nonuniformities created by convective flow in the coated layer and greater than 2 microns to enable sufficient wetting of the perovskite solution 64a with the flexible multilayer substrate 60. A backing roller 22 or set of rollers is used to set the engagement, gap or load to the deposition device 21.

To optimize drying conditions in the first drying step, the amount of air flow around the wet coating on the multilayer substrate 60 can optionally be controlled by constraining the movement of air above the wet coating with an air flow control device 27 such as screens, baffles or plenums. The temperature and humidity of deposition section 20 may be controlled by an environmental controller 25a to optimize the coating and drying conditions in deposition section 20. Optional control of the temperature of backing roller 22 is envisioned as well as control of the temperature of the flexible multilayer substrate prior to and subsequent to the deposition device 21 as depicted by plenums 23a and 23b, however, heated rollers, or heated fixed curved surfaces are also envisioned to control the temperature of the flexible multilayer substrate with conductive heating. Backing roller 22 can act as a substrate heating device that heats the flexible multilayer substrate. The backing roller 22 can have fluid flowing through it to maintain a preset temperature. This type of roller is sometimes called a jacketed roller. The preferred range that a substrate heating device heats the flexible multilayer substrate to prior to depositing the layer of perovskite solution is between 30 and 100 degrees Celsius.

The flexible multilayer substrate 60 enters a fast-drying section 30 with the wet coating of the perovskite solution on the flexible multilayer substrate 60 that was applied by deposition device 21. The first drying step is defined by the removal of a first portion of perovskite solution in the region between the deposition device 21 and the fast-drying section 30. The amount of solvent removed in the first drying step is an important factor in making a uniform coating. This first drying step is affected by: the length of the first drying region, which is the distance between the deposition location 26 and the entrance of the fast-drying section 30; the temperature of deposition section 20, the temperature, speed, surface energy, and surface area of the flexible multilayer substrate 60; the amount of air flow around the wet coating of the perovskite solution on the flexible multilayer substrate 60 in the first drying region; and the formulation of the perovskite solution. The preferred temperature of the area around the flexible multilayer substrate 60 and the perovskite solution is between 30 and 100 degrees Celsius during the first drying step.

The fast-drying section 30 defines a second drying step where a second portion of the solvent from the perovskite solution is removed, where the second drying step has a higher rate of solvent evaporation than the first drying step. Any suitable device that causes rapid solvent removal from the wet coating can be used and may include a non-contact drying device 31 or a contact drying device 32 where contact is defined by physically contacting the flexible multilayer substrate. Non-contact drying devices include air knives, infrared heaters, microwave heaters, convection ovens, Rapid Thermal Processors, and high energy photonic devices such as Xenon lamps. Contact drying devices include conduction heaters such as heated rollers or station curved plates that contact the side of the web opposite the wet coating. A non-contact drying device 31 used in the preferred embodiment of the disclosure is an air knife that blows gas, such as air or nitrogen, across the surface of the coating to lower the solvent vapor pressure and quickly remove the evaporating solvent. The temperature of the gas is optionally controlled (not shown). Some non-contact drying devices may benefit by the use of a nearby backing roller or rollers to control the spacing to the non-contact device 31 or to aid in drying the perovskite solution. The temperature and humidity of the fast-drying section 30 may also be controlled by an environmental controller 25b to optimize the conditions of the second drying step.

The second drying step causes a conversion reaction in the perovskite solution that is induced by the rapid evaporation of the solvent from the solution causing saturation of the solids and crystal formation or formation of an intermediate phase. The conversion reaction is typically readily visually apparent as it changes the color or optical density of the perovskite solution. The degree of color change and change in optical density of the perovskite solution depends on the type and quantity of perovskite precursors that are present in the deposited perovskite solution. In order to create a uniform perovskite layer the conversion reaction must be fast in the second drying step so that the movement of the crystals is minimized as they are formed. The conversion reaction that occurs in the second drying step causes the perovskite solution to have a large reduction in the transmission of visible light. Preferably, the percent transmission of visible light through the perovskite solution due to the conversion reaction in the second drying step is reduced by at least a factor of 2. The percent transmission of visible light is defined by the amount of visible light leaving the sample divided by the amount of visible light entering the sample and can be measured by known methods such as directing white light on the deposited perovskite solution both prior to entering and after exiting the second drying location. The percent transmission of visible light is determined by measuring the visible light intensity both entering and exiting the flexible multilayer substrate at the two locations. If the flexible multilayer substrate is opaque then a reflection measurement can be used to determine percent transmission of visible light through the perovskite solution.

Using an air knife as a drying device in the second drying step and both lead (II) iodide and methylammonium iodine as perovskite precursors, it has been observed that the color of the coated layer changed from yellow to dark brown in the second drying step, indicating successful perovskite conversion. To achieve a uniform coating at high speed it has been determined that the conversion reaction, as evidenced by the color change and change in percent transmission of visible light, must occur quickly, preferably in a second drying step dwell time of less than 0.5 seconds after the second drying device first acts on the perovskite solution. When an air knife is used as the drying device, the air knife first acts on the perovskite solution at the focal point of the air flow directed to the perovskite solution residing on the multilayer substrate, which is defined by the intersection of a line drawn from the source of the air flow to the flexible multilayer substrate where the angle of the line is such that the line follows the air flowing from the air knife. For optical drying devices, for example, an infrared heater, the location where the drying device acts on the perovskite is defined by the location where a significant portion of the optical radiation first strikes the perovskite solution, i.e., more than 5 percent of the optical energy has impinged on the perovskite solution out of the total amount that impinges on the perovskite solution from the optical device. The temperature of the layer of perovskite solution 64b can be increased to speed the evaporation rate in the second drying step. The preferred temperature in the area around the flexible multilayer substrate and the perovskite solution is greater than 30 degrees Celsius during the second drying step.

The dwell time of the first drying step is also important to obtaining a uniform coating at high speed. If the first drying step is too fast then convective flow in the layer of perovskite solution 64a creates artifacts, such as mottle, in the completed perovskite layer 64d. In addition, enough of the solvent must be removed in the first drying step so that the layer of perovskite solution can be dried quickly in the second drying step. If the first drying step does not remove enough solvent prior to the second drying step then nonuniformities in the coating, such as blow marks, are formed in the perovskite layer during the second drying step. Furthermore, if too much solvent is removed in the first drying step then solids form in the layer of perovskite solution that create artifacts and nonuniformities in the completed perovskite layer. In a preferred embodiment the first drying step has a dwell time that is at least 5 times longer than the second drying step dwell time, preferably at least 10 times longer.

To form a uniform perovskite layer on the flexible multilayer substrate it has been found that between 40 percent and 75 percent of the initial amount of solvent should preferably be removed from the perovskite solution in the first drying step to create a layer of partially dry perovskite solution 64b. This range is bounded by the need for an ink that is both stable for use in a production environment and also can be dried uniformly. For example, when using 2-methoxyethanol as a solvent and methylammonium lead iodide precursors with a total solids concentration of 33 weight percent, then 43 to 70 percent of the initial amount of the solvent must be removed in the first drying step to concentrate the perovskite solution to between 46 and 62 weight percent of solids. The amount of solvent and the total solids concentration at the end of the first drying step can be measured by monitoring the wet thickness with a low coherence interferometer mounted at the end of the first drying step and calculating the perovskite solution total solids concentration and amount of solvent using the known the initial thickness and total solids concentration of the perovskite solution. In addition, the amount of solvent remaining after the second drying step should be less than 10 percent of the initial amount of solvent, and preferably less than 5 percent of the initial amount of solvent. Furthermore, it is preferred that the first drying step increases the total solids concentration of the perovskite solution to at least 75 percent of its saturation concentration (measured in weight percent solids), and more preferably to at least 90 percent of its saturation concentration, so that the subsequent conversion of the solution to a thin film of immobile crystals can occur rapidly in the second drying step.

After the second drying step, the perovskite solution has changed from a solution or colloidal suspension to a layer comprised of immobile perovskite crystals or intermediates. However, to make a high performance photovoltaic device an additional annealing step is typically required. The function of the annealing step can include the removal of residual solvents, the removal of excess volatile perovskite solution components, the growth of perovskite crystals, a dissolution-recrystallisation process (Ostwald ripening effect) of the perovskite crystals, conversion of intermediates to perovskite crystals, and changes in perovskite crystal boundaries. In the long duration heating section 40 of FIG. 3 the flexible multilayer substrate is conveyed over a series of conveyance rollers 41a-41e. The entire structure of the long duration heating section 40 is enclosed to maintain a consistent temperature and air flow that is maintained by the environmental controller 25c. In some embodiments of the disclosure there is more than one compartment (not shown) in the long duration heating section 40, each with a separately controlled temperature and air flow.

The annealing time of the layer of immobile perovskite crystals or intermediates 64c (FIG. 2c) is important for producing high performance photovoltaic devices. In various embodiments, e.g., the annealing step may include heating the Perovskite layer to a temperature greater than 90 degrees Celsius for at least 30 seconds. For a flexible support 61 that can withstand high temperatures without distorting, such as thin flexible glass, metal foil, polysulfone, and polyimide, increasing the temperature of the long duration heating section 40 of FIG. 3 can reduce the required time to make a high performance perovskite layer. For flexible supports that can withstand high temperatures the preferred temperature of the area around the flexible multilayer substrate and the perovskite layer is between 120 and 300 degrees Celsius during the annealing step. For a flexible support 61 that cannot withstand high temperatures, such as PET, PC, and PEN, the area around the flexible multilayer substrate and the perovskite layer is preferred to be between 90 and 125 degrees Celsius during the annealing step to minimize distortion of the flexible support 61.

A rapid annealing device can be employed to reduce the length of the heating section or to increase the production speed when using some perovskite formulations. One method to reduce the long duration heating time is to rapidly heat one or more of the thin film coatings 62, 63, and 64c of the flexible multilayer substrate 60 to high temperature for a short duration (FIG. 2c). If the thin film coatings are heated directly without significantly heating the flexible support 61 then it is even possible to make high performance devices on low temperature flexible support 61 without the need for a very long oven. Short duration, high temperature heating of any of the thin film coatings 62, 63, and 64c does not distort a low temperature flexible support 61 because the dissipation of heat from the thin film coatings into the low temperature flexible support 61 is low due to the large difference in thickness between them: the low temperature flexible support 61 is typically more than 150 times thicker than the thin film coatings 62, 63, and 64c.

FIG. 3 shows that the flexible multilayer substrate is conveyed from the long duration heating section 40 to the short duration heating section 50. Short duration heating section 50 contains a short duration heater 51, such as a Rapid Thermal Processing unit or a high energy photonic device, e.g. a Xenon lamp. A backing roller 52 or set of rollers can be optionally used to set the gap to the short duration heater 51. The temperature and humidity of the short duration heating section 50 may also be controlled by an environmental controller 25d to optimize the conditions of the short duration heating section 50.

For some embodiments of the disclosure the long duration heating section 40 is eliminated and only the short duration heating section 50 is used. For some embodiments of the disclosure both the long duration heating section 40 and the short duration heating section 50 are used. For some embodiments of the disclosure only the long duration heating section 40 is used.

The flexible multilayer substrate 60 moves at nearly a constant speed through the R2R deposition and drying device 100 (FIG. 3). To clarify some important locations in the R2R deposition and drying device 100, a first location is defined by the region where the perovskite solution is deposited on the flexible multilayer substrate 60 by the deposition device 21. A second location is defined by the region between the deposition device 21 and the fast-drying section 30. A third location is defined as the fast-drying section 30. A fourth location is defined as the region where the perovskite layer is heated in the annealing step by the annealing device. The fourth location in FIG. 3 is the long duration heating section 40 and may include the region in the optional short duration heating section 50. The flexible multilayer substrate 60 in the R2R deposition and drying device 100 is preferred to move at a speed greater than 5 meters per minute and more preferred to be greater than 10 meters per minute as it moves from a first location to a second location, and from the second location to a third location. In a preferred embodiment of the disclosure the perovskite layer is heated by an annealing device in an annealing step at the fourth location, wherein the flexible multilayer substrate is preferred to move a speed greater than 5 meters per minute and more preferred to move at a speed greater than 10 meters per minute from the third location to the fourth location. Examples of annealing devices for use in the annealing step include a convection oven, a Rapid Thermal Processor, a photonic device (e.g. an infrared radiation source or a xenon lamp), a heated roller, and a stationary heated curved surface.

In a preferred embodiment of the disclosure the flexible multilayer substrate is moving at a constant speed from the first location to the second location, and moving at the same constant speed from the second location to the third location, and the second drying step causes a conversion reaction in the perovskite solution that changes the color of the perovskite solution.

Methods and devices (not shown in FIG. 3) are envisioned to contain and control particulate contaminates for the entire R2R deposition and drying device 100 or for one or more of the sections 20, 30, 40, and 50. Devices and methods to clean particulates from the flexible multilayer substrate include forced air, sticky rollers, and electrical discharge devices. Devices and methods to clean the air and to maintain specified clean room conditions include forced air through HEPA filters and positive pressure in enclosures. Methods and devices to remove and condition solvent vapors are envisioned but not shown in FIG. 3 nor are devices to remove unwanted gases or byproducts such as ozone and nitric oxides. Static control devices are commonly used in devices that convey flexible webs but are not shown in FIG. 3.

Figure 4:
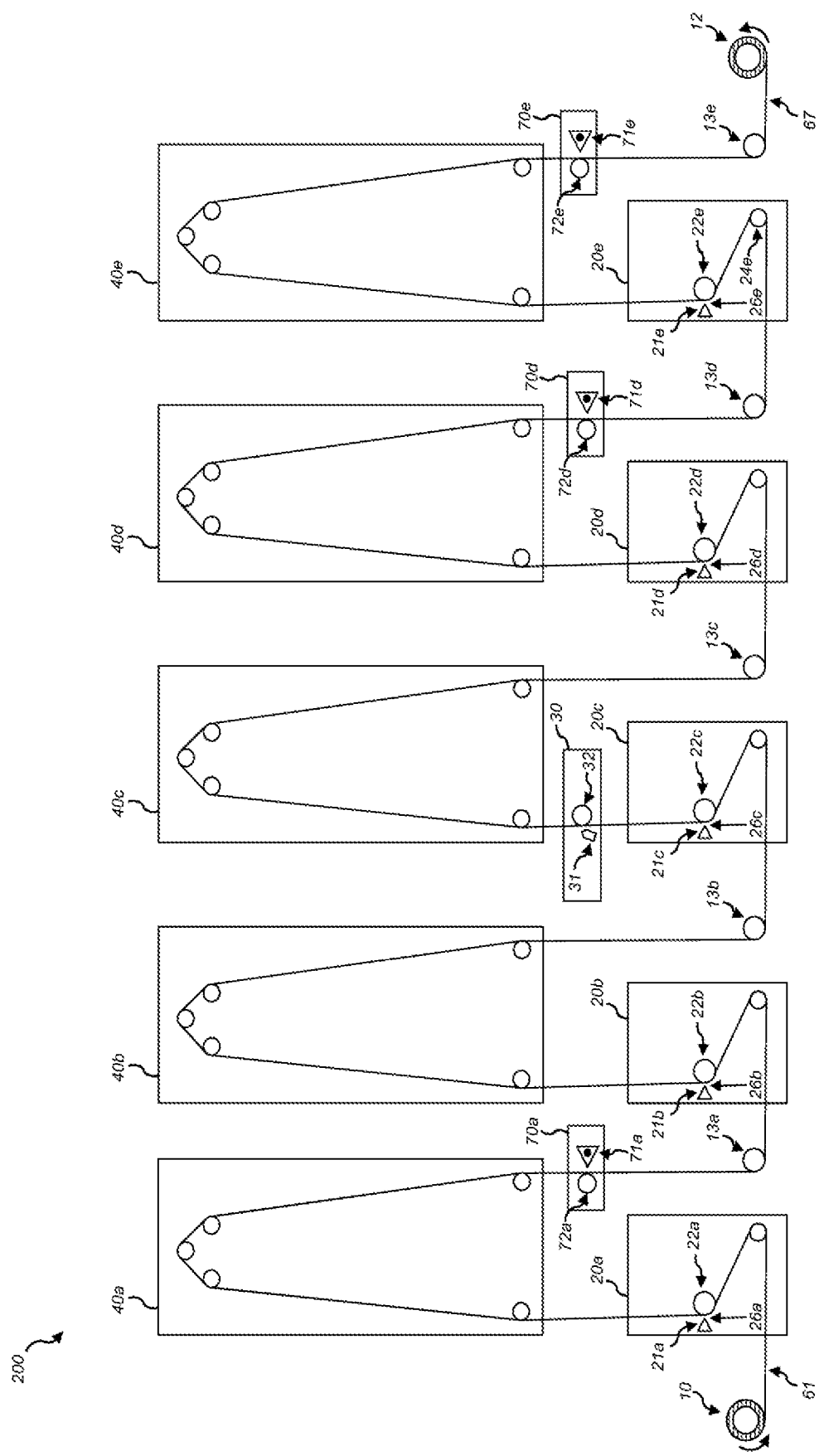
FIG. 4 is a schematic side view of an exemplary multi-station deposition and drying device for roll-to-roll printing a photovoltaic device on a flexible multilayer substrate.

FIG. 4 shows a schematic of an exemplary multi-station R2R deposition and drying device 200 for roll-to-roll printing a photovoltaic device on a flexible substrate that will be used to describe preferred embodiments of the disclosure. A station of the multi-station R2R deposition and drying device 200 is defined as comprising a deposition section but other sections and devices may be part of the station. Additional configurations can be adapted to enable the multistep process of the disclosure by those skilled in the art to make some or all layers of perovskite devices, especially perovskite solar cells. While FIG. 4 shows five stations, more or less than five stations are envisioned for variations on preferred embodiments of the disclosure. For example, a multi-station R2R deposition and drying device with three stations (not shown) could be used to apply a first carrier transport layer, a perovskite absorber layer, and a second carrier transport layer in succession on top of a flexible substrate having a first electrode layer and a support layer. Another example is a multi-station R2R deposition and drying device with four stations (not shown) where the first electrode layer is formed on the flexible substrate in the first station of the multi-station R2R deposition and drying device prior to the deposition of the first carrier transport layer. In this example, the device is supplied with a flexible substrate having only a support layer. Alternatively, when the multi-station R2R deposition and drying device is provided with a flexible substrate having a support and a first electrode layer, the fourth station could be used to apply a second electrode layer on to the second carrier layer. A multi-station R2R deposition and drying device with more than five stations is envisioned to make photovoltaic devices that require additional layers that improve the performance or functionality of the photovoltaic devices.

In FIG. 4 a flexible support 61 is unwound from a unwind roll 10 and threaded through five deposition sections 20a-e and five long duration heating sections 40a-e, in a continuous inline process to make a perovskite device 67. The direction of movement of the flexible substrate 61 through the multi-station R2R deposition and drying device 200 is identified by the arrows adjacent to the unwind roll 10 and the rewind roll 12. Additional devices after each deposition section or long duration heating section are envisioned and some are shown in FIG. 4 and described below. Each deposition section 20a-e deposits a functional solution on to the flexible support 61 at the associated deposition location 26a-e with a deposition device 21a-e. Each long duration heating section 40a-e heats the functional solution deposited by the associated deposition device to dry, cure, anneal, and/or sinter the functional solution. Typically, process setpoints for each long duration heating section 40a-e are different as they are optimized for the solution that is deposited by the associated deposition device. Likewise, the process configurations and setpoints for each deposition section 20a-e may also be different from each other.

A preferred embodiment of a multi-station R2R deposition and drying device 200 the disclosure is described here in more detail. Deposition section 20a deposits a first electrode solution on the flexible support 61 with a first electrode deposition device 21a. Long duration heating section 40a dries and sinters the first electrode solution to form a first electrode layer. The flexible substrate with the first electrode layer then travels to the deposition section 20b where a first carrier transport solution is deposited on the first electrode layer with a first carrier transport deposition device 21b. Long duration heating section 40b dries and sinters the first carrier transport solution to form a first carrier transport layer. The flexible substrate with the first electrode layer and the first carrier transport layer then travels to the deposition section 20c where a perovskite solution is deposited on the first carrier transport layer with a perovskite solution deposition device 21c. A first portion of the initial amount of solvent in the deposited perovskite solution is removed in section 20c in a first drying step, similarly as described for section 20 in FIG. 3. After deposition section 20c, the flexible substrate travels through a second drying step fast drying section 30, where a second portion of the initial amount of solvent in the deposited perovskite solution is removed. Note that the description of the fast drying section appears above in the description of FIG. 3, wherein the second drying step causes a conversion reaction in the perovskite solution that is induced by the rapid evaporation of the solvent from the solution causing saturation of the solids and crystal formation or formation of an intermediate phase. After fast drying section 30, Long duration heating section 40c further dries and anneals the coated perovskite solution to form a perovskite layer. The flexible substrate with the first electrode layer, the first carrier transport layer, and the perovskite layer then travels to the deposition section 20d where a second carrier transport solution is deposited on the perovskite layer with a second carrier transport deposition device 21d. Long duration heating section 40d dries the second carrier transport solution to form a second carrier transport layer. The flexible substrate with the first electrode layer, the first carrier transport layer, the perovskite layer, and the second carrier transport layer then travels to the deposition section 20e where a second electrode solution is deposited on the second carrier transport layer with a second electrode deposition device 21e. Long duration heating section 40e dries the second electrode solution to form a second electrode layer. The flexible substrate with the five functional layers is then wound onto a rewind roll 12. Laser etching of thin films is known in the art and used here to create a monolithic photovoltaic device as part of the inline continuous manufacturing process. Between the long duration heating section 40a and deposition section 20b, the flexible substrate travels through a laser etch unit 70a. Between the long duration heating section 40d and deposition section 20e, the flexible substrate travels through a laser etch unit 70d. Between the long duration heating section 40e and rewind roll 12, the flexible substrate travels through a laser etch unit 70e. Each laser etch unit contains a laser device 71a,d,e, and a laser etch backing roller 72a,d,e. The laser etch backing rollers 72a,d,e are used to ensure that the flexible support 61 is in a known location. A vision system (not shown) can be incorporated in one or more of the laser etch units 70a,d,e to increase the accuracy of the location that the laser etches. A control system (not shown) can be incorporated in one or more of the laser etch units 70a,d,e to position the laser spots based on data collected. Feed forward and feedback may be used in the control system. Laser etch unit 70a removes a portion of the first electrode layer. Laser etch unit 70d removes a portion of the second carrier transport layer, a portion of the perovskite layer, and a portion of the first carrier transport layer. Laser etch unit 70e removes a portion of the second electrode layer, a portion of the second carrier transport layer, a portion of the perovskite layer, and a portion of the first carrier transport layer.

All of the further sections and elements shown in FIG. 3 and described above are envisioned to be included in the preferred multi-station R2R deposition and drying device to make the perovskite layer, but are not shown in FIG. 4 for clarity. Some of the sections and elements shown in FIG. 3 are also envisioned for use in making the other layers in the multi-station R2R deposition and drying device but are not shown in FIG. 4 for clarity. For example, a surface treatment device 14 may be used to condition the of the flexible support 61 or one or more of the layers made on the flexible support 61 prior to entering each deposition section 20a-e, and environmental controllers may be used for some or all of the deposition sections 20a-e and long duration heating sections 40a-e.

The use of conveyance rollers and backing rollers for R2R machines have been described above and only a small number of conveyance rollers 13a-e and backing rollers 22a-e are identified in FIG. 4. Other conventional components in R2R deposition and drying devices are known in the industry are envisioned for use in the method of this disclosure but are not shown in FIG. 4.

EXAMPLE 1

A flexible multilayer substrate having a width of 25.4 cm was conveyed through a R2R deposition and drying device made by Polytype Converting for 3 trials at constant speeds of 30, 32, and 35 meters per minute. The Polytype Converting machine was modified as described below to enable the multistep drying method of the disclosure. The R2R deposition and drying device had an inline arrangement for conveying a continuous flexible substrate from an unwind roll through the following sections: a surface treatment device, a deposition and first drying step section, a second drying step fast drying section, and a long duration heating section. The flexible multilayer substrate with the perovskite layer was wound on a rewind roll. The flexible multilayer substrate had a polyester film as the flexible support, a thin layer of indium tin oxide as the first conducting layer, and poly(triaryl amine) as the first carrier transport layer. The surface treatment device was a corona discharge device that treated the coating surface of the flexible multilayer substrate with ozone prior to the deposition section. In the deposition section a 4.5 micron thick wet laydown of perovskite solution was deposited on to the flexible multilayer substrate using a gravure cylinder in direct mode as the deposition device. The gravure cylinder was heated to a temperature of 40 degrees Celsius and maintained at that temperature while the perovskite solution was deposited. The perovskite solution had 33 weight percent solids with an equal molar mixture of lead (II) iodide and methylammonium iodide and a liquid comprising 99.25 percent by volume of 2-methoxyethanol and 0.75 percent by volume of dimethyl sulfoxide. The saturation concentration of the perovskite solution is 62 weight percent solids at 20 degrees Celsius. The distance from the deposition location to the fast drying section was 1.4 meters and defines the region of the first drying step. The first drying step included heating the substrate with a fixed curved surface 0.4 meters in length that contacted the backside of the moving flexible multilayer substrate across its entire width. The fixed curved surface was maintained at 73.6 degrees Celsius. The second drying step, occurring in the fast drying section, included an air knife that blew nitrogen out of a 75 micron wide slot on to the perovskite solution to increase the rate of solvent evaporation from the deposited perovskite solution relative to the first drying step. The slot was positioned 1.5 cm from the moving substrate and ran across the width of the moving substrate. The focal point of the air knife was positioned at the downstream end of the fixed curved surface at an angle of 20 degrees relative to the web, pointing away from the deposition location. Nitrogen gas was supplied to the air knife at a flow rate of 40 standard cubic feet per minute. The long duration heating section consisted of a convection oven 18 meters in length set to a temperature of 120 degrees Celsius.

In the first drying step for the three trials, up to 70 percent of the initial solvent was removed, concentrating the perovskite solution to as high as 62 weight percent solids. In the fast drying step for the trials, a conversion reaction of the perovskite solution was observed to occur between 0 and 8 centimeters downstream from the focal point of the air knife. The conversion reaction caused the transparent yellow perovskite solution to turn dark brown and become opaque, evidencing that the percent transmission of visible light through the perovskite solution was reduced by a factor of greater than 2. A uniform perovskite layer approximately 0.5 microns thick was formed on the flexible multilayer substrate. In further trials, removing too little solvent in the first drying step (e.g., less than 40 percent of the initial amount of solvent) led to discontinuous perovskite layers with significant mottle caused by heterogeneous nucleation of perovskite crystals during the fast drying step. These perovskite layers were also observed to have obvious defects caused by crystal movement during the fast drying step. Removing too much solvent in the first drying step (e.g., greater than 75 percent of the initial amount of solvent) led to discontinuous perovskite layers with significant mottle caused by heterogeneous nucleation of perovskite crystals during the first drying step. The trial that produced the most uniform perovskite layer was achieved with the trial run at 32 meters per minute. For this trial a second transport layer and a second conducting layer were subsequently deposited onto the perovskite layer to make functioning photovoltaic devices.

EXAMPLE 2

A flexible multilayer substrate having a width of 15.2 cm was conveyed through a R2R deposition and drying device made by Eastman Kodak Company for 6 trials at the constant speeds of 11.9, 12.2, 12.5, 12.8, 13.1, and 13.4 meters per minute. The R2R machine was modified as described below to enable the multistep drying method of the disclosure. The R2R deposition and drying device had an inline arrangement for conveying a continuous flexible substrate from an unwind roll through the following sections: a deposition and first drying step section, a second drying step occurring in a fast drying section, and a long duration heating section. The flexible multilayer substrate with the perovskite layer was wound on a rewind roll. The flexible multilayer substrate had a polyester film as the flexible support, a thin layer of indium tin oxide as the first conducting layer, and poly(triaryl amine) as the first carrier transport layer. In the deposition section a 4.5 micron thick wet laydown of perovskite solution was deposited on to the flexible multilayer substrate using a slot die as the deposition device. The slot die was heated to a temperature of 50 degrees Celsius and maintained at that temperature while the perovskite solution was deposited. The back side of the flexible support was also heated to a temperature of 50 degrees Celsius in the deposition section using a temperature controlled roller, and maintained at that temperature while the perovskite solution was deposited. The perovskite solution had 33 weight percent solids with an equal molar mixture of lead (II) iodide and methylammonium iodide and a liquid comprising 99.25 percent by volume of 2-methoxyethanol and 0.75 percent by volume of N-methyl-2-pyrrolidone with 0.4 milligrams per milliliter of 1-α-phosphatidylcholine as an additive. The saturation concentration of the perovskite solution is 62 weight percent solids at 20 degrees Celsius. The distance from the deposition location to the fast drying section was 1 meter and defines the region of the first drying step. The first drying step included heating the substrate and deposited perovskite solution in a 0.7 meter section of an oven, over which a screen was positioned 3 cm above the moving web to limit air turbulence in the first drying step. The oven was controlled to approximately 35 degrees Celsius. The second drying step, occurring I the fast drying section, included an air knife that blew nitrogen out of a 75 micron wide slot on to the perovskite solution to increase the rate of solvent evaporation from the deposited perovskite solution relative to the first drying step. The slot was positioned 1.5 cm from the moving substrate and ran across the width of the moving substrate. The air knife was immediately downstream of the first drying step, fixed at an angle of 25 degrees relative to the web, pointing away from the deposition location. Nitrogen gas was supplied to the air knife at a flow rate of 40 standard cubic feet per minute. The long duration heating section consisted of a convection oven 11.88 meters in length set to a temperature of 120 degrees Celsius.

In the first drying step for the 6 trials, up to 70 percent of the initial solvent was removed, concentrating the perovskite solution to as high as 62 weight percent solids. In the fast drying step for the trials, a conversion reaction of the perovskite solution was observed to occur between 0 and 5 centimeters downstream from the focal point of the air knife. The conversion reaction caused the transparent yellow perovskite solution to turn dark brown and become opaque, evidencing that the percent transmission of visible light through the perovskite solution was reduced by a factor of greater than 2. A uniform perovskite layer approximately 0.5 microns thick was formed on the flexible multilayer substrate. In further trials, removing too little solvent in the first drying step (e.g., less than 40 percent of the initial amount of solvent) led to discontinuous perovskite layers with significant mottle caused by heterogeneous nucleation of perovskite crystals during the fast drying step. These perovskite layers were also observed to have obvious defects caused by crystal movement during the fast drying step. Removing too much solvent in the first drying step (e.g., greater than 75 percent of the initial amount of solvent) led to discontinuous perovskite layers with significant mottle caused by heterogeneous nucleation of perovskite crystals during the first drying step. The trial that produced the most uniform perovskite layer was achieved with the trial run at 12.8 meters per minute. For this trial a second transport layer and a second conducting layer were subsequently deposited onto the perovskite layer to make functioning photovoltaic devices with power conversion efficiency exceeding 10 percent.

The multistep drying method described here has been found to produce very uniform perovskite layers and enables reliable, high speed production of low cost, high efficiency perovskite devices. While the methods described here use roll-to-roll conveyance, a sheet fed system is envisioned for some of the embodiments where the substrate is provided to sections and devices in the form of a sheet. Perovskite devices include electromagnetic radiation sensors, photovoltaic devices, and light emitting devices. The invention has been described in detail with particular reference to certain preferred embodiments thereof, but it will be understood that variations and modifications can be effected within the spirit and scope of the invention.

PARTS LIST 10 unwind roll
12 rewind roll
13 conveyance roller
13a-e conveyance rollers
14 surface treatment device
20 deposition/first drying step section
20a-e deposition sections for associated stations of the multi-station R2R deposition and drying device
21 deposition device
21a first electrode deposition device
21b first carrier transport deposition device
21c perovskite solution deposition device
21d second carrier transport deposition device
21e second electrode deposition device
22a-e backing rollers for associated deposition sections
26a-e deposition locations for associated deposition sections
22 backing roller
23a-b air plenum
24 conveyance roller
25a-d environmental controller
26 deposition location
27 air flow control device
30 fast drying/second drying step section
31 non-contact drying device
32 contact drying device
40 long duration heating section
40a-e long duration heating sections for associated stations of the multi-station
R2R deposition and drying device
41a-e conveyance roller
50 short duration heating section
51 short duration heater
52 backing roller
60 flexible multilayer substrate
61 flexible support
62 first conducting layer
63 first carrier transport layer
64a layer of perovskite solution
64b layer of partially dry perovskite solution
64c immobile layer of perovskite crystals or intermediates
64d completed perovskite layer
65 second carrier transport layer
66 second conducting layer
67 perovskite device
70a,d,e laser etch units for associated stations of the multi-station R2R deposition and drying device
71a,d,e laser etch devices for associated laser etch unit
72a,d,e laser etch backing rollers for associated laser etch unit
100 roll-to-roll (R2R) deposition and drying device
200 multi-station R2R deposition and drying device

The invention claimed is:

1. A method of making a perovskite absorber photovoltaic device comprising: providing a substrate; depositing a first carrier transport solution layer with a first carrier transport deposition device to form a first carrier transport layer on the substrate; depositing a Perovskite solution comprising solvent and perovskite precursor materials with a Perovskite solution deposition device on the first carrier transport layer; drying the deposited Perovskite solution to form a Perovskite absorber layer; and depositing a second carrier transport solution with a second carrier transport deposition device to form a second carrier transport layer on the Perovskite absorber layer, wherein the deposited Perovskite solution is dried at least partially with a fast drying device which causes a conversion reaction and the Perovskite solution to change in optical density by at least a factor of 2 in less than 0.5 seconds after the fast drying device first acts on the Perovskite solution.

2. The method of claim 1 wherein the substrate is flexible.

3. The method of claim 2 wherein the substrate is provided from a roll.

4. The method of claim 3 wherein the speed of the substrate is greater than 5 meters per minute as it moves from the roll to the first carrier transport deposition device.

5. The method of claim 1 wherein the substrate comprises a support layer and an electrode layer.

6. The method of claim 5 wherein the electrode layer is transparent.

7. The method of claim 1, further comprising depositing an electrode layer on the substrate with an electrode deposition device.

8. The method of claim 7 wherein the electrode layer is transparent.

9. The method of claim 1 wherein the speed of the substrate is greater than 5 meters per minute as the substrate moves from the first carrier transport deposition device to the Perovskite solution deposition device and the speed of the substrate is greater than 5 meters per minute as the substrate moves from the Perovskite solution deposition device to the second carrier deposition device.

10. The method of claim 1 wherein the total solids concentration of the deposited Perovskite solution when entering the fast drying device is at least 75 percent of its saturation concentration.

11. The method of claim 1 wherein the substrate is provided in the form of a sheet.

12. The method of claim 1 further comprising depositing an electrode layer on the second carrier transport layer with an electrode deposition device.

13. The method of claim 1 wherein the substrate comprises a support comprising a material selected from the group consisting of polyethylene terephthalate, polyethylene naphthalate, polycarbonate, polyimide, polysulfone, metal foil, or glass.

14. The method of claim 1 wherein the Perovskite absorber layer is heated to a temperature greater than 90 degrees Celsius for at least 30 seconds.

15. The method of claim 1 wherein the Perovskite solution solvent has a boiling point below 135 degrees Celsius.

16. The method of claim 1 wherein the perovskite solution deposition device comprises a component selected from the group consisting of slot die, gravure, spray, flexographic, dip, inkjet, rod, or blade.

17. The method of claim 1 further comprising removing portions of the first carrier transport layer, the Perovskite absorber layer, or the second carrier transport layer with a laser device.

18. A method of making perovskite absorber photovoltaic devices in a continuous inline process comprising: providing a flexible substrate from a roll; depositing a first carrier transport layer on the flexible substrate; depositing a Perovskite solution on the first carrier transport layer; drying the deposited Perovskite solution to form a Perovskite absorber layer; depositing a second carrier transport layer on the Perovskite absorber layer; and depositing an electrode layer, wherein the deposited Perovskite solution is dried at least partially with a drying device which increases the optical density of the deposited Perovskite solution by at least a factor of 2 in less than 0.5 seconds after the drying device first acts on the deposited Perovskite solution.

19. The method of claim 18 further comprising removing portions of the first carrier transport layer, the Perovskite absorber layer, the second carrier transport layer, or the electrode layer from the flexible substrate with a laser device.

20. The method of claim 18 further including depositing a transparent electrode layer on the flexible substrate.

* * * * *